United States Patent
Ikuta et al.

(10) Patent No.: US 9,083,179 B2
(45) Date of Patent: Jul. 14, 2015

(54) LOAD CIRCUIT DISCONNECTION DETECTOR

(75) Inventors: Yoshinori Ikuta, Susono (JP); Akinori Maruyama, Susono (JP); Yoshihide Nakamura, Susono (JP); Keisuke Ueta, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 28 days.

(21) Appl. No.: 13/991,647

(22) PCT Filed: Nov. 29, 2011

(86) PCT No.: PCT/JP2011/006653
§ 371 (c)(1),
(2), (4) Date: Jun. 5, 2013

(87) PCT Pub. No.: WO2012/077297
PCT Pub. Date: Jun. 14, 2012

(65) Prior Publication Data
US 2013/0249696 A1   Sep. 26, 2013

(30) Foreign Application Priority Data

Dec. 9, 2010   (JP) ................................ 2010-274328

(51) Int. Cl.
*G08B 17/06* (2006.01)
*H02H 3/08* (2006.01)
(Continued)

(52) U.S. Cl.
CPC .............. *H02H 3/085* (2013.01); *H02H 6/005* (2013.01); *G01R 31/04* (2013.01); *Y02E 10/56* (2013.01)

(58) Field of Classification Search
CPC .............. H02H 5/00; H02H 5/04; H02H 9/00
USPC .................. 361/103, 93.8, 18, 93.1; 340/593
See application file for complete search history.

(56) References Cited

U.S. PATENT DOCUMENTS 5,854,731 A * 12/1998 Thomas ....................... 361/93.8
8,054,602 B2   11/2011 Takahashi
(Continued)

FOREIGN PATENT DOCUMENTS

CN     101652927 A    2/2010
EP      1850438 A2   10/2007
(Continued)

OTHER PUBLICATIONS

Japanese official action issued on Nov. 11, 2014 in the counterpart Japanese patent application.
(Continued)

*Primary Examiner* — Steven Lim
*Assistant Examiner* — Kaleria Knox
(74) *Attorney, Agent, or Firm* — Marvin A. Motsenbocker; Mots Law, PLLC

(57) ABSTRACT

A load circuit disconnection detector includes: a current sensor (16) for detecting current flowing through a wire (W1) of a load circuit; and a protective device (100) for estimating temperature of the wire (W1) based on the detected current and forcibly turning off a semiconductor switch (Q1) if the estimated temperature of the wire reaches threshold temperature. The load circuit disconnection detector determines that there is a connection failure in the load circuit if a temperature increase calculated by a temperature calculation unit (24) is zero even a predetermined time (P1) after the semiconductor switch (Q1) is turned on.

10 Claims, 3 Drawing Sheets

(51) Int. Cl.
*H02H 6/00* (2006.01)
*G01R 31/04* (2006.01)

(56) References Cited

U.S. PATENT DOCUMENTS

| | | | |
|---|---|---|---|
| 2007/0253132 A1* | 11/2007 | Nakamura et al. | 361/103 |
| 2010/0014195 A1* | 1/2010 | Takahashi | 361/18 |
| 2011/0080681 A1 | 4/2011 | Maruyama et al. | |

FOREIGN PATENT DOCUMENTS

| | | |
|---|---|---|
| JP | H10-250476 A | 9/1988 |
| JP | H10-319777 A | 12/1988 |
| JP | H11-509400 A | 8/1999 |
| JP | 2004-183501 A | 7/2004 |
| JP | 2007-295776 A | 11/2007 |
| WO | 97/04511 A1 | 2/1997 |
| WO | 2007/139108 A1 | 12/2007 |
| WO | 2009/151084 A1 | 12/2009 |

OTHER PUBLICATIONS

Chinese official action issued on Jul. 25, 2014 in the counterpart Chinese patent application.
Chinese office action letter issued on Mar. 27, 2015 in the counterpart Chinese patent application.
Japanese office action letter issued on May 26, 2015 in the counterpart Japanese patent application.

* cited by examiner

LOAD CIRCUIT DISCONNECTION DETECTOR

TECHNICAL FIELD

The present invention relates to a disconnection detector instantly detecting disconnection or open-circuit faults of wire provided for a load circuit.

BACKGROUND ART

Various loads mounted on vehicles are connected to batteries through wires, connectors, junction blocks, relay blocks, electronic switches such as semiconductor switches, and the like. In such a load circuit, it is necessary to check whether the load is normally connected to the electronic switch. Specifically, disconnection of wires and poor connection of connectors occur in some cases (hereinafter, disconnection, poor connection, and open-circuit faults are collectively referred to as disconnection). In such a case, the load circuit cannot be normally operated. Accordingly, some disconnection detectors for detecting disconnection of load circuits have been proposed and put into practical use.

The conventional disconnection detectors employ a method of detecting disconnection using a current detection circuit for detecting disconnection provided for a load circuit (see PTL 1) or a method of detecting disconnection by providing a shunt resistor for a load circuit and measuring voltage generated across the shunt resistor.

CITATION LIST

Patent Literature

[PTL_1]
WO 2007/139108 A1

SUMMARY OF INVENTION

However, in such a conventional disconnection detector as described above, it is necessary to provide a lot of parts, detection circuits, and the like for detecting disconnection of a load circuit. The size of the circuit configuration is therefore increased, and the cost thereof is increased.

The present invention was made to solve the aforementioned conventional problems, and an object of the present invention is to provide a load circuit disconnection detector capable of detecting disconnection of a load circuit with the size of the circuit configuration thereof not increased.

In order to achieve the aforementioned object, a load circuit disconnection detector according to a first aspect of the present invention breaks a load circuit when temperature of a wire of the load circuit increases and detects occurrence of disconnection in the load circuit, the load circuit supplying electric power outputted from a power supply to a load and driving the same. The load circuit disconnection detector includes: a current detector for detecting current flowing through the wire of the load circuit; an electronic switch for switching between on and off of the load circuit; a temperature estimator for calculating a temperature increase of the wire with a predetermined sampling period based on the current detected by the current sensor when the electronic switch is turned on and estimating temperature of the wire a predetermined period of time after the electronic switch is turned on; and a switch controller for controlling on and off of the electronic switch based on a drive instruction and forcibly turn off the electronic switch when the temperature of the wire estimated by the temperature estimator reaches a previously set threshold temperature. The switch controller determines that a connection failure is caused in the load circuit if the temperature increase calculated by the temperature estimator is equal to zero a predetermined period of time after the electronic switch is turned on.

Preferably, the load circuit disconnection detector according to the first aspect of the present invention further includes an operation switch configured to set a diagnosis mode of the load circuit. When the operation switch is operated to set the diagnosis mode, the switch controller turns on the electronic switch only during a predetermined set conduction time and determines that the connection failure is caused in the load connected to the load circuit if the estimated temperature is equal to zero after the elapse of the conduction time.

More preferably, the load circuit disconnection detector according to the first aspect of the present invention further includes an alarm device for outputting an alarm signal if the switch controller determines that the connection failure is caused.

The load circuit disconnection detector according to the first aspect of the present invention includes the switch controller as a protective device which detects current flowing in the load circuit, estimates the wire temperature based on the detected current, and forcibly turns off the electronic switch if the estimated wire temperature reaches the threshold temperature. The disconnection detector according to the first aspect determines that there is a connection failure in the load circuit if the temperature increase is zero even a predetermined time (P1) after the electronic switch is turned on. Accordingly, it is not necessary to provide a lot of parts for disconnection detection. It is therefore possible to reduce the size of the detector and lower the cost.

DESCRIPTION OF EMBODIMENTS

Hereinafter, an embodiment of the present invention is described based on the drawings.

Figure 1:
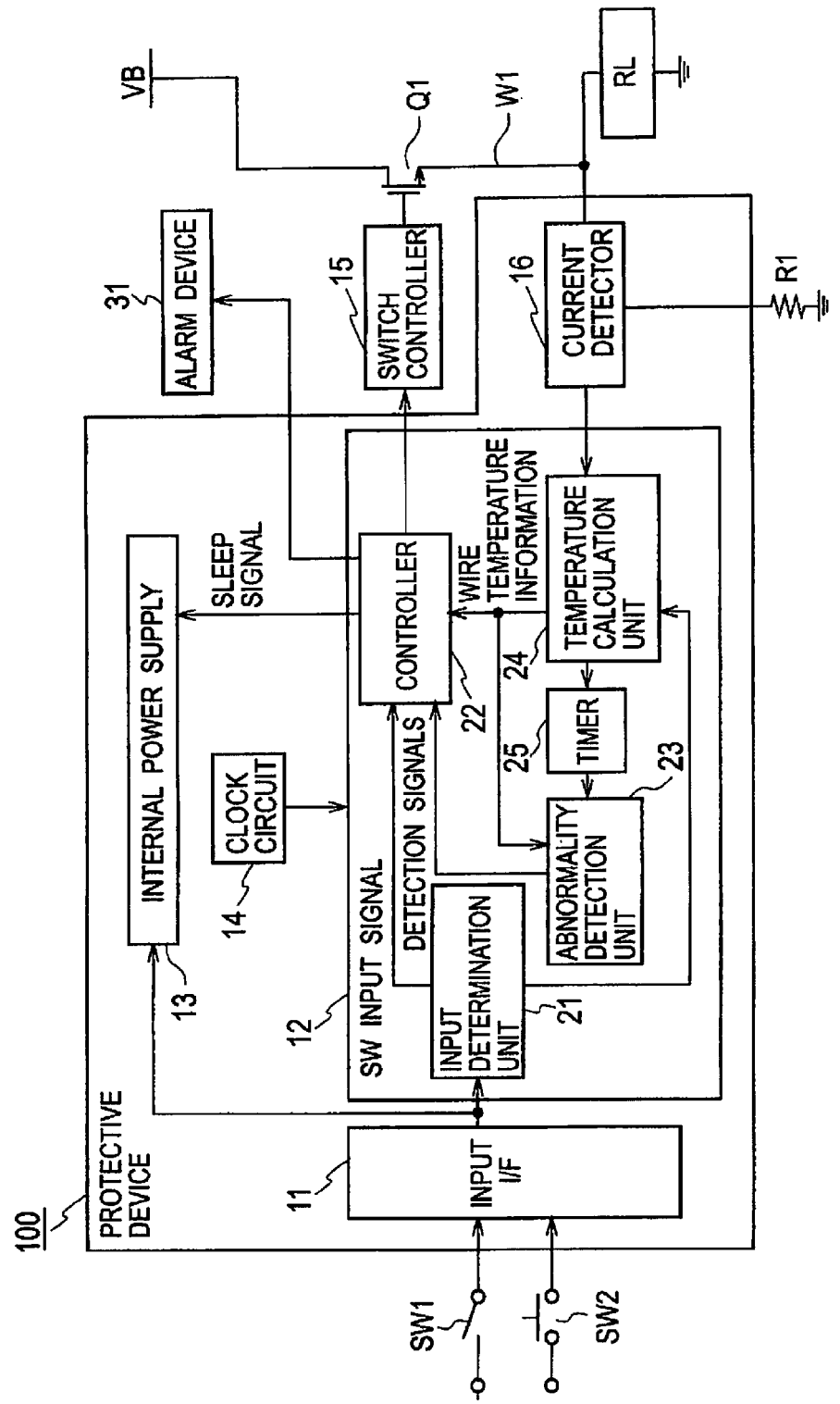
FIG. 1 is a circuit diagram illustrating a configuration of a disconnection detector according to an embodiment of the present invention and a load circuit provided with the disconnection detector.

FIG. 1 is a circuit diagram illustrating a configuration of a protective device including a disconnection detector according to the embodiment and a load circuit. As illustrated in FIG. 1, a protective device 100 according to the embodiment includes a function of detecting excess current flowing in a load circuit mounted on a vehicle to break the load circuit and detecting occurrence of disconnection in the load circuit.

The load circuit includes: a battery VB mounted on the vehicle; a semiconductor switch (electronic switch) Q1; a driver circuit 15 outputting a driving signal to the semiconductor switch Q1; and a load RL, which are connected through a wire W1. In some cases, a junction block, a connector, or the like is provided between the semiconductor switch Q1 and load RL (not illustrated in the drawings).

The protective device 100 has a function of, when excess current flows in the load circuit to overheat the wire W1 of the load circuit, turning off the semiconductor switch Q1 to protect the entire load circuit against overheating. The protective device 100 includes an input I/F 11, a logic circuit 12, an internal power supply 13, a clock circuit 14, and a current sensor 16 detecting current flowing in the load circuit.

When an externally provided load-drive switch SW1 is turned on or when an operation switch SW2 used for diagnosing the load is turned on, the input I/F 11 detects the switch SW1 or SW2 be turned on and outputs an on instruction signal to the logic circuit 12 and an internal power supply start signal to the internal power supply 13. The load-drive switch SW1 is a switch which is turned on to drive the road RL. The road RL is driven when the load-drive switch SW1 is on and the semiconductor switch Q1 is turned on. The operation switch SW2 is a switch turned on for a diagnosis whether the load RL normally operates. When the operation switch SW2 is turned on, the operation of the protective device 100 goes into a diagnosis mode, and the semiconductor switch Q1 is turned on during a predetermined conduction time.

The internal power supply 13 includes a function of generating a desired constant voltage from voltage supplied from the battery VB mounted on a vehicle and supplying drive power to each element of the protective device 100. When supplied with the internal power supply start signal from the input I/F 11, the internal power supply 13 supplies output voltage to each element. When supplied with a sleep signal for stopping the internal power supply from the logic circuit 12, the internal power supply 13 stops outputting voltage. In other words, the internal power supply 13 operates at a normal mode when receiving the internal power supply start signal and goes into a sleep mode to stop outputting power when supplied with the sleep signal.

The clock circuit 14 outputs a clock signal to drive the logic circuit 12 and outputs the same to the clock circuit 12.

Figure 2:
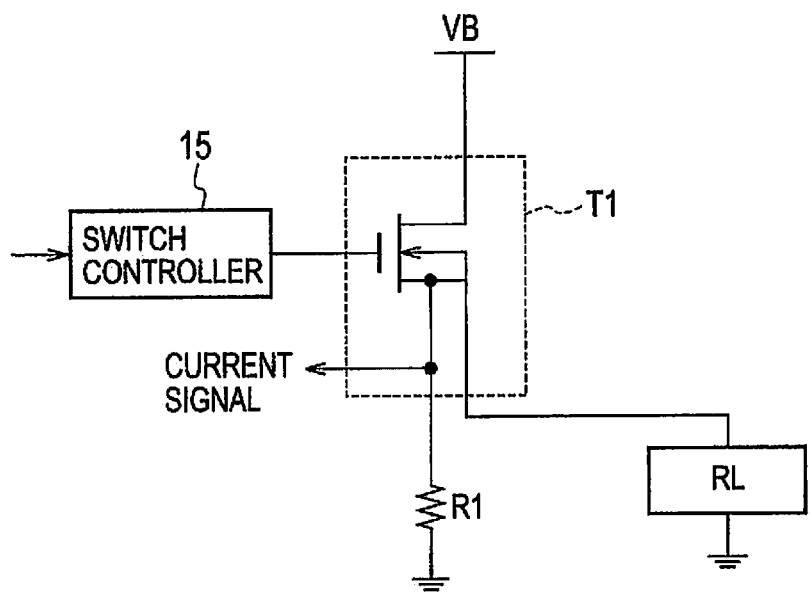
FIG. 2 is a circuit diagram illustrating a specific configuration of a semiconductor switch and a current sensor of the load circuit provided with the disconnection detector according to an embodiment of the present invention.

The current sensor 16 detects current flowing in the load circuit and outputs the detected current signal to the logic circuit 12. One of the methods to detect current uses a multi-source FET as the semiconductor relay Q1 and uses a current value measured by the multi-source FET, for example. FIG. 2 is a circuit diagram in the case of using a multi-source FET (T1). The part indicated by reference numeral T1 corresponds to the semiconductor switch Q1 and current sensor 16 illustrated in FIG. 1. When current is flowing in the load circuit, current proportional to the load current flows through the sub-source terminal of the multi-source FET (T1). Accordingly, the load current can be detected by measuring voltage caused between the both ends of a detection resistor R1. Moreover, the current sensor 16 is not limited to the multi-source FET (T1) and can be configured to detect current using a shunt resistor, for example.

The logic circuit 12 includes an input determination unit 21, a controller 22, a timer 25, an abnormality detection unit 23, and a temperature calculation unit 24. When the on instruction signal is outputted from the input I/F 11, the input determination unit 21 outputs the on instruction signal to the controller 22 and a temperature measurement instruction signal to the temperature calculation unit 24.

When supplied with the temperature measurement instruction signal from the input determination unit 21, the temperature calculation unit 24 calculates a heat-generating temperature or a heat-releasing temperature of the wire W1 at each sampling period based on the current value measured by the current sensor 16 and the sampling period determined by the clock signal outputted from the clock circuit 14, thus estimating current wire temperature. The method of estimating the wire temperature is described later. The wire temperature information calculated by the temperature calculation unit 24 is outputted to the controller 22, timer 25, and abnormality detection unit 23.

The timer 25 measures time elapsed since the temperature calculation unit 24 starts to calculate the wire temperature. When the elapsed time reaches a predetermined period P1 of time previously set, the timer 25 outputs a time measurement end signal to the abnormality detection unit 23.

Based on the wire temperature calculated by the temperature calculation unit 24, the abnormality detection unit 23 outputs an abnormal temperature detection signal to the controller 22 when the wire temperature reaches a previously set threshold temperature (150 degrees Celsius, for example). Moreover, the abnormality detection unit 23 determines whether the calculated temperature has increased during the predetermined period P1 of time when receiving the time measurement end signal from the timer 25. If the calculated temperature has not increased, that is, if the temperature increase of the wire W1 during the predetermined period P1 of time after the semiconductor switch Q1 is turned on is equal to zero, the abnormality detection unit 23 outputs a disconnection detection signal to the controller 22.

The controller 22 outputs a drive instruction signal to the driver circuit 15 when supplied with the on instruction signal from the input determination unit 21. The driver circuit 15 then outputs a drive signal to a control terminal of the semiconductor switch Q1 (for example, the gate of an MOSFET), and the semiconductor switch Q1 is then turned on to drive the load RL. On the other hand, when the on instruction signal supplied from the input determination unit 21 is stopped, the driver circuit 15 stops outputting the drive instruction signal. The controller 22 therefore turned of the semiconductor switch Q1 to stop the load RL.

Furthermore, when supplied with the abnormal temperature detection signal from the abnormality detection unit 23, the controller 22 stops outputting the drive instruction signal to forcibly turn off the semiconductor switch Q1. Moreover, when supplied with the disconnection detection signal from the abnormality detection unit 23, the controller 22 outputs an alarm signal to an alarm device 31. Furthermore, if the wire temperature calculated by the temperature calculation unit 24 is reduced to a previously set sleep threshold (temperature set a little higher than the ambient temperature), the controller 22 outputs a sleep signal to the internal power supply 13. When receiving the sleep signal, the internal power supply 13 goes into a sleep mode to stop the output of voltage.

The alarm device 31 alerts a user through a buzzer, a lamp, or the like when supplied with the alarm signal from the controller 22.

Next, a description is given of a temperature estimation process in the temperature calculation unit 24. The wire temperature estimation process can employ a method described in WO 2009/151084A, for example.

When current is flowing through the wire W1, an amount of heat X1 generated by the wire W1 per unit length is expressed by the following equation (1).

$$X1 = I^2 Ron\, dt \quad (1)$$

Herein, I is current detected by the current sensor 16; Ron, resistance per unit length of the wire W1; and dt, sampling time (dt is 5 msec, for example).

An amount of heat Y1 released from the wire W1 per unit length can be expressed by the following equation (2).

$$Y1 = Q/(Cth * Rth/dt) \quad (2)$$

Herein, Cth* is pseudo-thermal capacity of the wire W1 (thermal capacity set smaller than real thermal capacity); Rth, thermal resistance of the wire W1 per unit length; and Q, an amount of heat of the wire W1 per unit length (wire temperature multiplied by Cth*).

Wire temperature measured at current sampling Tn can be expressed by the following equation (3) where the wire temperature measured at previous sampling is Tp (ambient temperature initially).

$$Tn=Tp+(X1-Y1)/Cth^* \qquad (3)$$

The threshold temperature which is used as a condition for turning off the semiconductor switch Q1 is set to the fuming temperature (150 degree Celsius, for example) of the wire W1. When the wire temperature Tn calculated by the equation (3) reaches the threshold temperature, control is made to turn off the semiconductor switch Q1. This allows the semiconductor switch Q1 to be surely turned off before smoke is emitted from the wire W1. Specifically, when the wire temperature Tn reaches the threshold temperature, the real temperature of the wire W1 is lower than the threshold temperature since the wire temperature Tn is calculated using the pseudo-thermal capacity (Cth*). Accordingly, the semiconductor switch Q1 is turned off before the wire W1 emits smoke, thus preventing overheating of the wire W1.

Next, a description is given of an operation of the load circuit disconnection detector according to the embodiment configured as described above. Hereinafter, with reference to timing diagrams illustrated in FIGS. 3(a) to 3(d), the description is given of the cases where the semiconductor switch Q1 is turned off and no current is flowing in the load circuit, where normal current is flowing in the load circuit, where excess current flows in the load circuit, and where a connection failure occurs in the load circuit.

(i) Case where the semiconductor switch Q1 is turned off and no current is flowing through the wire W1

Figure 3:
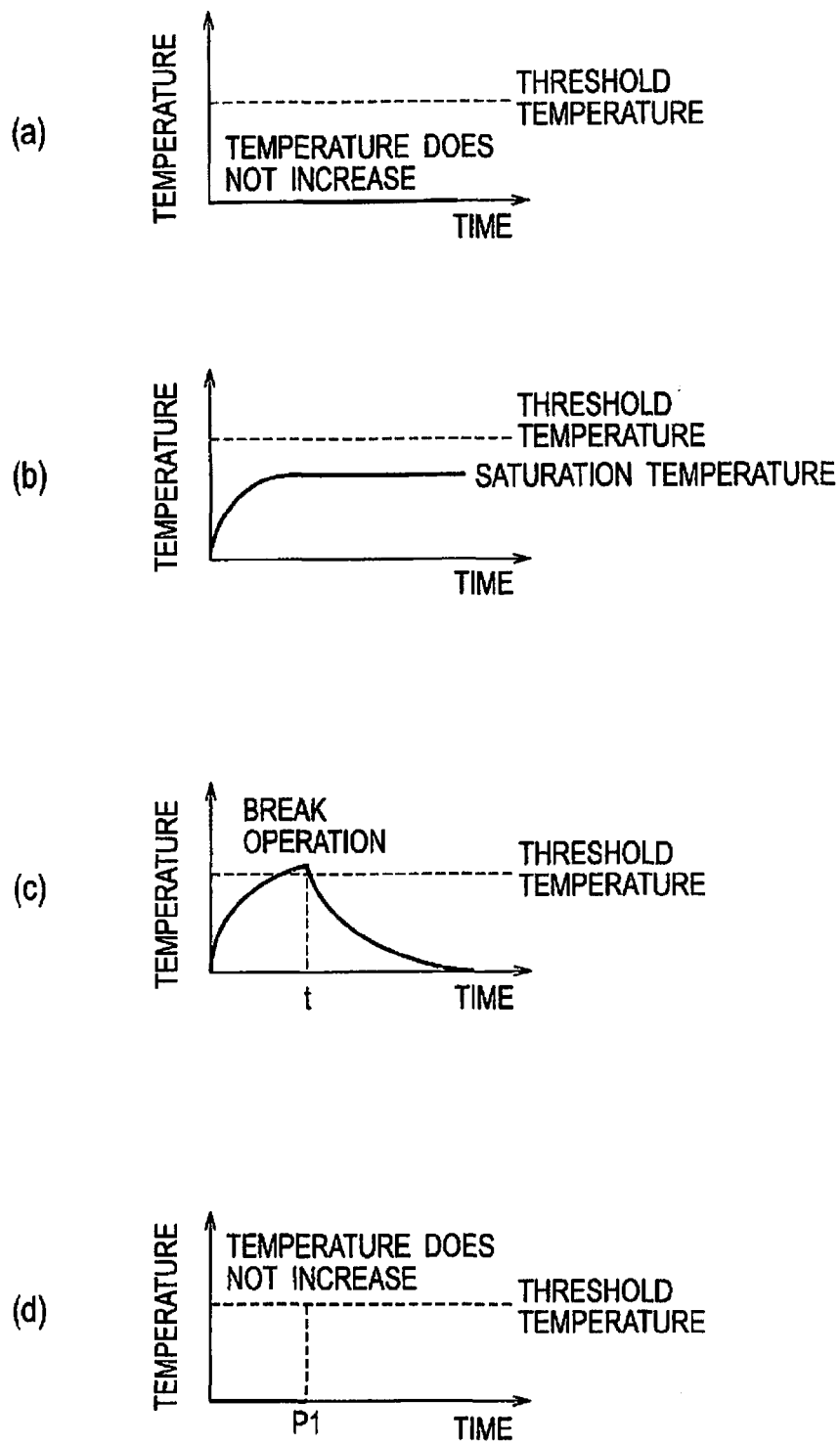
FIGS. 3a-3d are characteristic diagrams illustrating a relation between time and estimated temperature in the disconnection detector according to an embodiment of the present invention.

When the semiconductor switch Q1 is turned off and no current is flowing through the wire W1, as illustrated in FIG. 3(a), the current detected by the current sensor 16 is zero. Accordingly, the temperature increase calculated by the temperature calculation unit 24 is zero, and the wire temperature is equal to the ambient temperature.

(ii) Case where normal current is flowing in the load circuit

When the semiconductor switch Q1 is turned on and current flows through the wire W1 to drive the load RL, the current sensor 16 detects current. Based on the temperature calculation logics in the equations (1) to (3), the temperature calculation unit 24 calculates the temperature of the wire W1 at each sampling period. At this time, as illustrated in FIG. 3(b), the temperature of the wire W1 increases with time and is stabilized at the saturation temperature (ambient temperature+temperature increase). Since the saturation temperature is lower than the threshold temperature, the semiconductor switch 1 remains on, and the load RL continues to be driven.

(iii) Case where excess current flows in the load circuit

Consideration is given to the case where the semiconductor switch Q1 is turned on and excess current flows through the wire W1. At this time, as illustrated in FIG. 3(c), when the estimated temperature of the wire W1 calculated by the temperature calculation unit 24 exceeds the threshold temperature, the abnormality detection unit 23 detects that the estimated temperature of the wire W1 exceeds the threshold temperature and outputs the abnormal temperature detection signal to the controller 22. The controller 22 stops the drive instruction signal outputted to the driver circuit 15 to forcibly turn off the semiconductor switch Q1. Accordingly, the load circuit is broken before the wire W1 emits smoke. The load circuit can be therefore protected.

(iv) Case where a connection failure occurs in the load circuit

When there is a connection failure in the load circuit, no current flows through the wire W1 even if the semiconductor switch Q1 is turned on. Accordingly, the temperature increase calculated by the temperature calculation unit 24 is zero. If the abnormality detection unit 23 detects that the temperature increase of the wire W1 is zero when the time measured by the timer 25 is the predetermined period P1 of time, the abnormality detection unit 23 outputs the disconnection detection signal to the controller 22. The controller 22 then outputs the alarm signal to the alarm device 31. The alarm device 31 alerts to notify the user of the connection failure in the load circuit.

Furthermore, the operation switch SW2 is operated to bring the operation of the protective device 100 into the diagnosis mode. Specifically, if the user turns on the operation switch SW2, the drive instruction signal to turn on the semiconductor switch Q1 during a previously set conduction time (time longer than the aforementioned period P1 of time) is inputted, and the controller 22 turns on the semiconductor switch Q1 only during the conduction time. When the load circuit normally operates, the temperature estimated by the temperature calculation unit 24 increases due to heat generation corresponding to the conduction time. On the other hand, in the event of a connection failure in the load circuit, the temperature increase of the wire W1 remains zero even after the elapse of the conduction time. If the temperature increase is zero, the alarm device 31 alerts in a similar manner to the aforementioned process. The user can be therefore informed of the connection failure caused in the load circuit. In short, by turning on the operation switch SW2, it can be diagnosed whether the wire W1 constituting the load circuit and the load RL are operating normally.

FIG. 1 illustrates the example where the occurrence of a connection failure is informed by the alarm device 31. However, it can be configured that a signal indicating the occurrence of a connection failure is sent to an upper system as a diagnosis signal using an LIN (local interconnect network) or a CAN (controller area network) mounted on a vehicle or the like.

In such a manner, the load circuit disconnection detector according to the embodiment employs the protective device 100 which estimates the wire temperature based on the current detected by the current sensor 16 and, if the estimated temperature reaches the threshold temperature, turns off the semiconductor switch Q1 to protect the circuit against overheating. When the temperature increase of the wire W1 estimated by the temperature calculation unit 24 is zero after the elapse of the predetermined period P1 of time even though the semiconductor switch Q1 is turned on, it is determined that there is a connection failure in the load circuit.

Accordingly, disconnection in the load circuit can be detected with a very simple configuration without separately providing a disconnection detecting circuit or a shunt resistor like in the conventional way. The size of the detector can be reduced, and the cost thereof can be further lowered.

Moreover, even in the case of not actually driving the load circuit, if the operation switch SW2 is turned on, the semiconductor switch Q1 is turned on only during the previously set conduction time for disconnection detection. Accordingly, it is possible to easily perform a diagnosis of a connection failure for a load whose operation is difficult to check.

Furthermore, in the event of a connection failure, the user is notified by the alarm device 31 of the connection failure.

Accordingly, the user can instantly recognize the occurrence of disconnection in the load circuit and can start maintenance work.

Hereinabove, the load circuit disconnection detector of the present invention is described based on the embodiment illustrated in the drawings. The present invention is not limited to this, and the configuration of each unit can be substituted with one including an arbitrary configuration and equivalent functions.

For example, in the above description of the embodiment, the electronic switch is the semiconductor switch such as a MOSFET. However, the present invention is not limited this, and the electronic switch can be composed of a relay circuit including a relay coil and a relay contact.

INDUSTRIAL APPLICABILITY

The present invention is applicable to detection of connection failures of load circuits with a simple method.

The invention claimed is:

1. A load circuit disconnection detector which breaks a load circuit when temperature of a wire of the load circuit increases and detects occurrence of disconnection in the load circuit, the load circuit supplying electric power outputted from a power supply to a load and driving the same, the disconnection detector comprising:
   a current sensor for detecting current flowing through the wire of the load circuit;
   an electronic switch for switching between on and off of the load circuit;
   a temperature estimator for calculating a temperature increase of the wire in accordance with a sampling of the current detected by the current sensor that is performed at a predetermined sampling period and estimating temperature of the wire in a predetermined period of time after the electronic switch is turned on, in which the temperature of the wire is calculated to be a reference ambient temperature when the electronic switch was turned on; and
   a switch controller for controlling on and off of the electronic switch based on a drive instruction and forcibly turning off the electronic switch when the temperature of the wire estimated by the temperature estimator reaches a previously set threshold temperature, wherein
   the switch controller determines that a connection failure is caused in the load circuit if the temperature increase of the wire calculated by the temperature estimator at a most recent sampling period, in relation to the temperature of the wire calculated at a sampling period just prior to the most recent sampling period, is equal to zero, the most recent sampling period occurring a predetermined period of time after the electronic switch is turned on.

2. The load circuit disconnection detector of claim 1, further comprising
   an operation switch for setting a diagnosis mode of the load circuit, wherein
   when the operation switch is operated to set the diagnosis mode, the switch controller turns on the electronic switch only during a predetermined set conduction time and determines that the connection failure is caused in the load connected to the load circuit if the estimated temperature is equal to zero after the elapse of the conduction time.

3. The load circuit disconnection detector of claim 1, further comprising
   an alarm device for outputting an alarm signal if the switch controller determines that the connection failure is caused.

4. The load circuit disconnection detector of claim 2, further comprising
   an alarm device for outputting an alarm signal if the switch controller determines that the connection failure is caused.

5. The load circuit disconnection detector of claim 1, wherein, after forcibly turning off the electronic switch by the switch controller when the temperature of the wire estimated by the temperature estimator reaches the previously set threshold temperature, when the estimated temperature is calculated to be slightly higher than the ambient temperature, the switch controller outputs a sleep signal to an internal power supply to cause the internal power supply to stop outputting voltage to the load circuit.

6. A controlling method of a load circuit disconnection detector which breaks a load circuit when temperature of a wire of the load circuit increases and detects occurrence of disconnection in the load circuit, the load circuit supplying electric power outputted from a power supply to a load and driving the same, the controlling method comprising:
   detecting current flowing through the wire of the load circuit by a current sensor;
   calculating a temperature increase of the wire in accordance with a sampling of the current detected by the current sensor that is performed at a predetermined sampling period;
   estimating temperature of the wire in a predetermined period of time after the electronic switch is turned on, in which the temperature of the wire is calculated to be a reference ambient temperature when the electronic switch was turned on;
   controlling on and off of the electronic switch based on a drive instruction and forcibly turning off the electronic switch when the estimated temperature of the wire reaches a previously set threshold temperature; and
   determining that a connection failure is caused in the load circuit if the temperature increase of the wire calculated at a most recent sampling period, in relation to the temperature of the wire calculated at a sampling period just prior to the most recent sampling period, is equal to zero, the most recent sampling period occurring a predetermined period of time after the electronic switch is turned on.

7. The controlling method of claim 6, further comprising:
   setting a diagnosis mode of the load circuit when an operation switch is operated to set the diagnosis mode;
   turning on the electronic switch in the diagnosis mode only during a predetermined set conduction time; and
   determining that the connection failure is caused in the load connected to the load circuit if the estimated temperature is equal to zero after the elapse of the conduction time.

8. The controlling method of claim 6, further comprising:
   outputting an alarm signal when determining that the connection failure is caused.

9. The controlling method of claim 7, further comprising:
   outputting an alarm signal when determining that the connection failure is caused.

10. The controlling method of claim 6, further comprising:
    outputting, after forcibly turning off the electronic switch by the switch controller when the temperature of the wire estimated by the temperature estimator reaches the previously set threshold temperature, and when the estimated temperature is calculated to be slightly higher than the ambient temperature, a sleep signal to an internal power supply to cause the internal power supply to stop outputting voltage to the load circuit.

* * * * *